(12) United States Patent
Bauer et al.

(10) Patent No.: US 7,714,422 B2
(45) Date of Patent: May 11, 2010

(54) ELECTRONIC MODULE WITH A SEMICONDUCTOR CHIP AND A COMPONENT HOUSING AND METHODS FOR PRODUCING THE SAME

(75) Inventors: Michael Bauer, Nittendorf (DE); Alfred Haimerl, Sinzing (DE); Angela Kessler, Regensburg (DE); Joachim Mahler, Regensburg (DE); Wolfgang Schober, Amberg (DE)

(73) Assignee: Infineon Technologies AG, Neubiberg (DE)

( * ) Notice: Subject to any disclaimer, the term of this patent is extended or adjusted under 35 U.S.C. 154(b) by 171 days.

(21) Appl. No.: 11/751,755

(22) Filed: May 22, 2007

(65) Prior Publication Data

US 2007/0268674 A1 Nov. 22, 2007

(30) Foreign Application Priority Data

May 22, 2006 (DE) .................. 10 2006 024 147

(51) Int. Cl.
*H01L 23/02* (2006.01)

(52) U.S. Cl. ................. 257/678; 257/675; 257/677; 257/693; 257/E21.499

(58) Field of Classification Search ......... 257/675–678, 257/693, 698, 700, 713, 737, 738, 796, 777, 257/E21.499

See application file for complete search history.

(56) References Cited

U.S. PATENT DOCUMENTS

| 5,220,489 | A | * | 6/1993 | Barreto et al. | 361/783 |
| 6,407,448 | B2 | | 6/2002 | Chun | |
| 2004/0046241 | A1 | * | 3/2004 | Combs et al. | 257/678 |
| 2008/0036034 | A1 | * | 2/2008 | Juskey et al. | 257/531 |

FOREIGN PATENT DOCUMENTS

| WO | 2005086235 A2 | 9/2005 |
| WO | 2006012846 A1 | 2/2006 |

* cited by examiner

*Primary Examiner*—Cuong Q Nguyen
*Assistant Examiner*—Cathy N Lam
(74) *Attorney, Agent, or Firm*—Edell, Shapiro & Finnan, LLC

(57) ABSTRACT

An electronic module includes a component housing and at least one semiconductor chip. The semiconductor chip is arranged on a circuit carrier in the component housing. The semiconductor chip is connected to an upper face of the circuit carrier via connection elements. In this case, the semiconductor chip, the connection elements and, partially, the circuit carrier are embedded in a plastic housing compound. A metal plate which is structured into lead interconnects and contact connecting pads is provided on the upper face of the component housing.

11 Claims, 5 Drawing Sheets

ELECTRONIC MODULE WITH A SEMICONDUCTOR CHIP AND A COMPONENT HOUSING AND METHODS FOR PRODUCING THE SAME

CROSS REFERENCE TO RELATED APPLICATIONS

This application claims priority under 35 U.S.C. §119 to Application No. DE 102006024147.9 filed on May 22, 2006, entitled "Electronic Module Having a Semiconductor Component Housing and Having a Semiconductor Chip, and a Method for its Production," the entire contents of which are hereby incorporated by reference.

BACKGROUND

The area extent of semiconductor component housings for embedding an integrated circuit semiconductor chip, connection elements and, partially, a circuit carrier in a plastic housing compound is continuously increasing owing to the complexity of integrated circuits in the semiconductor chips, whose area extent is likewise growing. However, electronic modules comprise not only semiconductor component housings with semiconductor chips arranged as appropriate in them, but have additional discrete components in the form of active and passive components. These discrete components are either arranged on a higher-level circuit board with the semiconductor component, or are integrated together with a semiconductor chip in a common semiconductor component housing, by also being embedded in the plastic housing compound.

If the discrete components of an electronic module are additionally arranged on the higher-level circuit board, then the space requirement on the higher-level circuit board disadvantageously also grows as the area extent of the semiconductor component housing increases. If, in contrast, the passive components are embedded in a common plastic housing compound for the semiconductor component housing, then the space required by the electronic module increases, and access to the embedded discrete components is virtually no longer possible after being embedded in the plastic housing compound. Therefore, individual customer demands for the fitment of different discrete components in an electronic module can not be provided.

A further disadvantage associated with the integration of the discrete components on a common circuit mount within a plastic housing is that the process control is more difficult. If the discrete components are fitted before the connection of the semiconductor chip to the circuit carrier, then there is a risk of contamination, for example with fluxes, for the contact pads or contact connecting pads. If the discrete components are fitted after the fixing of the connection elements, then there is a risk of the connection elements being damaged during the handling of the fitting and soldering of the discrete components. Finally, a further disadvantage is that defectively fitted and/or non-functional discrete components can no longer be removed from the plastic housing compound, or replaced within the plastic housing compound.

SUMMARY

An electronic module and a method for producing an electronic module are described herein. The electronic module includes a component housing and at least one integrated circuit chip such as a semiconductor chip. The semiconductor chip is arranged on a circuit carrier in the component housing. The semiconductor chip is connected to an upper face of the circuit carrier via connection elements. In this case, the semiconductor chip, the connection elements and, partially, the circuit carrier are embedded in a plastic housing compound. A metal plate which is structured into lead interconnects and contact connecting pads is provided on the upper face of the component housing.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention will now be explained in more detail with reference to the attached figures, where:

FIG. 1 shows a schematic plan view of a circuit carrier which is fitted with a semiconductor chip;

FIG. 2 shows a schematic cross section through the circuit carrier shown in FIG. 1, along the section plane A-A;

FIG. 3 shows a schematic plan view of the circuit carrier shown in FIG. 1, after fitment of a metal plate;

FIG. 4 shows a schematic cross section through the circuit carrier shown in FIG. 3, along the section plane A-A;

FIG. 5 shows a schematic plan view of a component housing before structuring of the metal plate;

FIG. 6 shows a schematic cross section through the component housing shown in FIG. 5, along the section plane A-A;

FIG. 7 shows a schematic plan view of the component housing shown in FIG. 6, after structuring of the metal plate;

FIG. 8 shows a schematic cross section through the component housing as shown in FIG. 7, along the section plane A-A;

FIG. 9 shows a schematic plan view of the electronic module according to one exemplary embodiment; and FIG. 10 shows a schematic cross section through the electronic module according to one exemplary embodiment, along the section plane A-A in FIG. 9.

DETAILED DESCRIPTION

Figure 1:
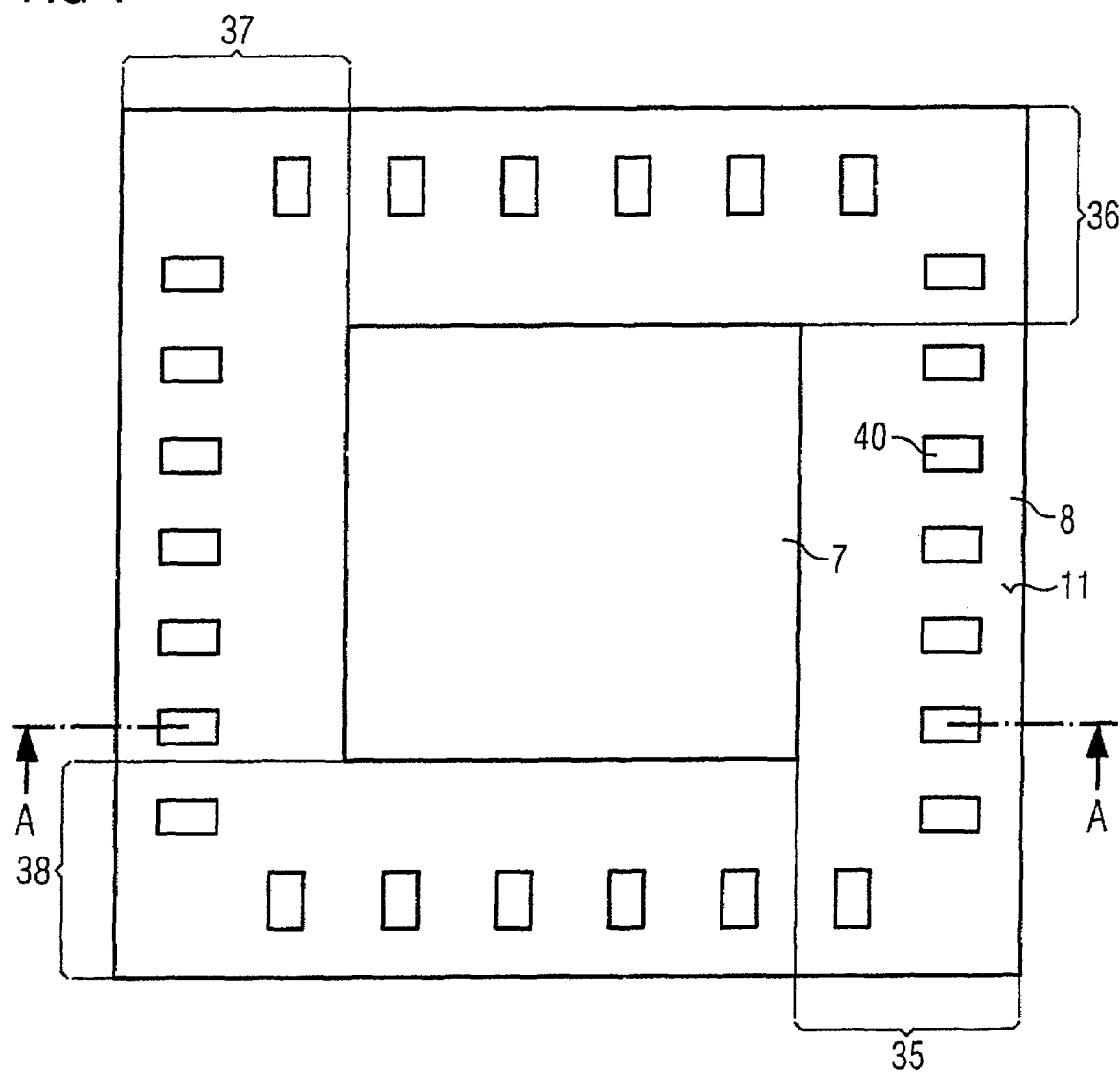
FIGS. 1 to 10 show schematic views of components during the production of an electronic module according to one exemplary embodiment.

An electronic module and a method for producing the same is described herein in which the increasing extent of component housings is made better use of and does not lead to an increased space requirement on a higher-level circuit board of the electronic module, while nevertheless ensuring access to discrete components of the electronic module, even after completion of the component housing. This electronic module allows customers to make changes and additions to the discrete components without the manufacturer having to develop costly, new, modified and appropriately adapted electronic modules.

The described electronic module includes a component housing and at least one integrated circuit chip such as a semiconductor chip. The semiconductor chip is arranged on a circuit carrier in the component housing. The semiconductor chip is connected to an upper face of the circuit carrier via connection elements. In this case, the semiconductor chip, the connection elements and, partially, the circuit carrier are embedded in a plastic housing compound. A metal plate which is structured into lead interconnects and contact connecting pads is provided on the upper face of the component housing. Furthermore, the lower faces of the lead interconnects and those of the contact connecting pads are embedded in the plastic housing compound.

The upper faces of the contact connecting pads of the structured metal plate are, in contrast, advantageously freely accessible. This electronic module therefore has the advantage that the continuously growing area extent of the component housings is used in order to arrange a structured metal plate on the upper face of the component housing. This can be used in order to fix discrete components of the electronic module on it in such a way that they can be arranged on a customer-specific basis and/or by the customer on the structured metal plate, without occupying any additional space on a chip carrier. It is therefore possible to use circuit carriers that cost little and are of good design.

In this context, the expression "area extent" is defined as the two-dimensional extent in which the semiconductor chips are growing continuously despite increase in circuit density. The described electronic module makes use of this fact and uses the semiconductor component housing, i.e., the upper face of the semiconductor component housing, as an additional fitment area for discrete components to be fitted in a space-saving manner.

Furthermore, the electronic module allows good thermal contact between the semiconductor chip and the circuit carrier. Moreover, custom-specific passive and active components can advantageously be fitted as discrete components on the contact connecting pads made available for this purpose on the structured metal plate. Another advantage of the described electronic module is that damaged discrete components of the electronic module can be easily replaced.

In one exemplary embodiment, the structured metal plate has angled leads on its edge faces, which are electrically connected to contact connecting pads on the upper face of the semiconductor component housing and are angled from the upper face in the direction of the circuit carrier such that their free ends are supported in edge areas of the upper face of the circuit carrier. For this purpose, the edge areas of the upper face of the circuit carrier have a number and arrangement of contact connecting pads corresponding to the number and arrangement of the angled leads on the structured metal plate.

This design of the structured metal plate has the advantage that it can be prepared in a similar manner to a leadframe of a conventional type and can be fitted to the circuit carrier above the angled lead after fitment of the semiconductor chip and after connection of the semiconductor chip to the circuit carrier. The unstructured metal plate rests above the semiconductor chip with its connection elements, and is supported on the angled leads. The angled leads advantageously at the same time form spacers between the metal plate and the circuit carrier, thereby maintaining a separation which is greater than the height of the semiconductor chip with connection elements disposed above the upper face of the circuit carrier.

The free ends of the lead, which extend from the semiconductor component housing upper face to the upper face of the circuit carrier, are preferably integrally connected to the contact connecting pads in the edge area of the circuit carrier. An integral connection such as this can be achieved by soldering of the lead ends and/or by adhesive bonding of the lead ends via a conductive adhesive.

The intermediate space between the structured metal plate and the upper face of the circuit carrier is filled with a plastic housing compound, embedding the semiconductor chip and the connection elements. In this case, in one embodiment, the leads which extend from the component housing upper face to the upper face of the circuit carrier are arranged on the edge faces of the component housing. In this case, the leads and the structured metal plate rest on the contour of the component housing. The external dimensions of the component housing are accordingly governed by the structured metal plate, the profile of the external leads on the edge faces of the component housing, and the circuit carrier.

In a further embodiment of the electronic module, the leads which extend from the component housing upper face to the upper face of the circuit carrier are embedded in the plastic housing compound. This has the advantage that the embedded leads improve the anchorage of the structured metal plate on the upper face of the lead housing, and additionally ensure isolation of the leads.

The semiconductor chip preferably includes flipchip contacts as connection elements to a wiring structure on the upper face of the circuit carrier. Contact connecting pads are provided for this purpose corresponding to the number and arrangement of the flipchip contacts on the wiring structure of the circuit carrier. The flipchip contacts are electrically and mechanically connected to these contact connecting pads of the wiring structure on the upper face of the circuit carrier. For this purpose, the flipchip contacts are either soldered to the contact connecting pads, or are fitted to them using a conductive adhesive.

In one alternative embodiment, the connection elements are bonding wires, with contact pads of the semiconductor chip being integrally connected via the bonding wires to contact connecting pads on the wiring structure of the circuit carrier. In this embodiment, the rear face of the semiconductor chip is integrally connected on a chip contact pad of the wiring structure on the upper face of the circuit carrier, and the bonding wires extend from contact pads in edge areas of the upper face of the semiconductor chip to corresponding contact connecting pads in the edge area of the upper face of the circuit carrier. The bonding wire embodiment increases the area extent of the component housing in comparison to the flipchip contact solution since additional contact connecting pads must be provided around the semiconductor chip on the circuit carrier.

At least one discrete component is preferably stacked on the structured metal plate, in which case the electrodes of the stacked component can be integrally and electrically conductively connected to the contact connecting pads of the structured metal plate on the component housing. Diodes, transistors, triacs, thyristors and/or varistors can be stacked as discrete components on the structured metal plate. Resistors, capacitors or inductive components are preferably arranged as passive components on the structured metal plate.

A method for producing an electronic module including a component housing comprises the following method steps. First of all, a circuit carrier is produced with the lower face of the circuit carrier at the same time also forming the lower face of the electronic module. Furthermore, semiconductor chips are produced, and at least one semiconductor chip is then fitted to the circuit carrier. During this process and/or after it, connections are made to some of the contact connecting pads via connection elements between the semiconductor chip and the circuit carrier. Furthermore, a metal plate is produced, with leads angled on the edge faces. The semiconductor chip is then provided with freestanding coverage with connection elements via the metal plate, with the free ends of the angled leads being integrally connected to contact connecting pads in edge areas of the circuit carrier.

Once the metal plate has been fixed above the semiconductor chip with connection elements in this way, the intermediate space between the metal plate and the upper face of the circuit carrier is filled with a plastic housing compound being introduced such that the semiconductor chip is embedded with the connection elements in a plastic housing compound, and a component housing is complete, with an upper face of the metal plate being exposed. During this process, the lower face of the metal plate is wetted with the plastic housing compound. Any dirt on the upper face of the metal plate can be removed, even subsequently, through the plastic housing compound. The metal plate on the upper face of the component housing is then structured into lead interconnects and contact connecting pads.

This method has the advantage that the circuit carrier as well as the semiconductor chips and the metal plate with angled leads on their edge faces can first of all be completed in parallel before these three main components are fixed to one another, without any plastic housing compound being introduced. The plastic housing compound can be introduced between the metal plate, which has not yet been structured, and the upper face of the circuit carrier by dispensing and/or by moulding and/or by fitting of a film composed of plastic housing compound.

During production of the circuit carrier, not only can a wiring structure be arranged on the upper face of the circuit carrier, but a further wiring structure can also be arranged on the lower face of the circuit carrier. For this purpose, the wiring structure on the upper face is equipped with contact connecting pads for connection elements to the semiconductor chip, and with contact connecting pads in the edge areas of the upper face of the circuit carrier for the fitment of leads in order to support the metal plate. The contact connecting pads of the structured metal plate are then electrically connected via interconnects to the vias through the circuit carrier, with external contact pads for the electronic module being provided on the lower face and being electrically connected to the vias via interconnects in the wiring structure on the lower face.

This production method for the circuit carrier has the advantage that a connection can be produced from the contact pads on the structured metal plate on the upper face of the component housing to external contact pads on the lower face of the electronic module in a cost-effective manner in terms of production engineering.

In order to produce a semiconductor chip, a plurality of semiconductor chip positions on a semiconductor wafer are first of all provided with the structure of the semiconductor chip, and the semiconductor wafer is then split into individual semiconductor chips. This method results in a plurality of semiconductor chips being created in parallel, which can then be used for an electronic module as described above.

In a further exemplary implementation of the method, during the fitment of the semiconductor chip to the circuit carrier, a semiconductor chip with flipchip contacts as connection elements is soldered to contact connecting pads on the wiring structure. This soldering may be performed via diffusion soldering or via the aid of a soft solder. Furthermore, it is also possible to create an electrical connection to the contact pads of the wiring structure on the circuit carrier by using a conductive adhesive.

In an alternative method, during the fitment of the semiconductor chip to the circuit carrier, the rear face of the semiconductor chip is fixed on a chip area of the wiring structure, and contact pads on the upper face of the semiconductor chip are then electrically connected to contact connecting pads on the upper face of the circuit carrier, via bonding wires as connection elements. Depending on whether a semiconductor chip is provided with flipchip contacts and/or a semiconductor chip is provided for bonding wires, the contact connecting pads on the circuit carrier can be prepared appropriately either underneath the semiconductor chip and/or around the semiconductor chip on the upper face of the circuit carrier.

A stamping and bending process is preferably used in order to produce a metal plate with leads angled on the edge faces. In the case of a stamping and bending process such as this, the metal plates which are required for the electronic module are stamped out with leads from a large-area metal plate, and the leads are at the same time angled on the edge faces of the metal plate.

In an alternative method, a metal plate with leads angled on the edge faces is produced by first of all using an etching process followed by a process for angling of the leads. For freestanding coverage of the semiconductor chip with connection elements by means of the metal plate, the metal plate must be adjusted extremely precisely at the free ends of the angled leads in relation to the prepared contact connecting pads of the wiring structure on the upper face of the circuit carrier, so that an integral connection can then be produced between the free ends of the leads and the contact connecting pads of the wiring structure. In this case as well, this integral connection can be produced either via solder techniques or adhesive techniques using a conductive adhesive.

In a further implementation example of the method, during the introduction of the plastic housing compound between the metal plate and the circuit carrier, the angled leads of the metal plate are also embedded in the plastic housing compound. The advantage of embedding the supporting leads in the plastic housing compound in this way has already been explained above, so that there is no need to discuss this again.

For structuring of the metal plate on the upper face of the semiconductor component housing, the metal plate is coated with a protective-lacquer structure photolithographically or by printer, and is then wet-chemically etched or dry-etched. After the etching process, the protective lacquer is removed from the now-structured metal plate with lead interconnects and contact connecting pads for the fitment of electrodes of the component to be stacked. A laser ablation process can also be used instead of etching.

Discrete components can be stacked by a customer, or on a customer-specific basis on the structured metal plate, with the electrodes of the component being integrally connected to the contact connecting pads on the structured metal plate. Discrete active components, such as diodes, transistors, triacs, thyristors and/or varistors may be fitted for stacking on the structured metal plate. It is also possible to use discrete passive components, such as resistors, capacitors or the inductive components on the structured metal plate. The discrete components may be chosen on a customer-specific basis and/or they may be chosen directly by the customer, in order to complete the electronic module.

In the following paragraphs, exemplary embodiments of the electronic module and method are described in connection with the figures. FIGS. 1 to 10 show schematic views of components during the production of an electronic module 1 according to one exemplary embodiment. Components having the same functions are identified with the same reference symbols in the successive FIGS. 1 to 10, and will not be re-described with each figure.

FIG. 1 shows a schematic plan view of a circuit carrier 8 which is fitted with an integrated circuit chip, such as a semiconductor chip 7. The semiconductor chip 7 is arranged in the centre of the upper face 11 of the circuit carrier 8, while contact connecting pads 40 are arranged on the edge areas 35, 36, 37 and 38 of the upper face 11 of the circuit carrier 8.

Figure 2:
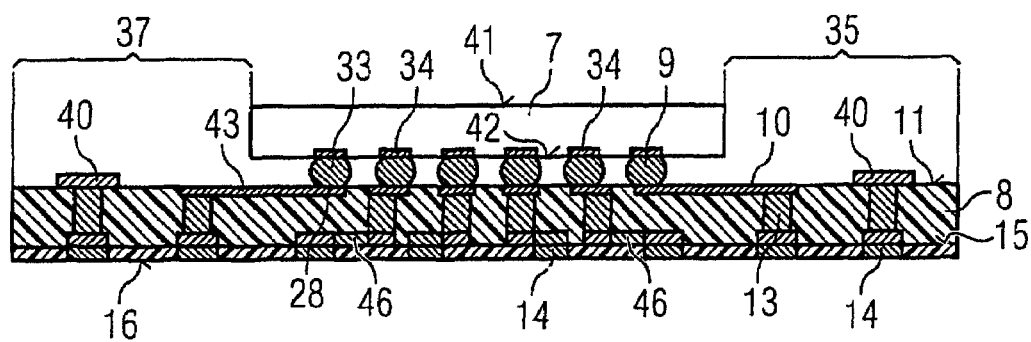

FIG. 2 shows a schematic cross section through the circuit carrier 8 as shown in FIG. 1, along the section line A-A. The semiconductor chip 7 in the center of the circuit carrier 8 has a rear face 41 and an upper face 42. The upper face 42 has contact pads 34 on which flipchip contacts 33 are arranged as connection elements 9 to the circuit carrier 8. These flipchip contacts 33 are integrally connected to contact connecting pads 28 on a wiring structure 10 on the upper face 11 of the circuit carrier 8. The wiring structure 10 has interconnects 43, which connect the contact connecting pads 28 for the flipchip contacts 33 to vias 13 through the circuit carrier 8, with a further wiring structure 46 being arranged on the lower face 15 of the circuit carrier 8, and connecting external contact pads 14 on the lower face 16 of the semiconductor component housing to the vias 13, so that the flipchip contacts 33 of the semiconductor chip 7 are electrically connected to the external contact pads 14. The contact connecting pads 40 which are arranged on the edge areas 35 to 38 of the circuit carrier 8 are likewise electrically connected through vias 13 to corresponding external contact pads 14 on the lower face 15 of the circuit carrier 8.

Figure 3:
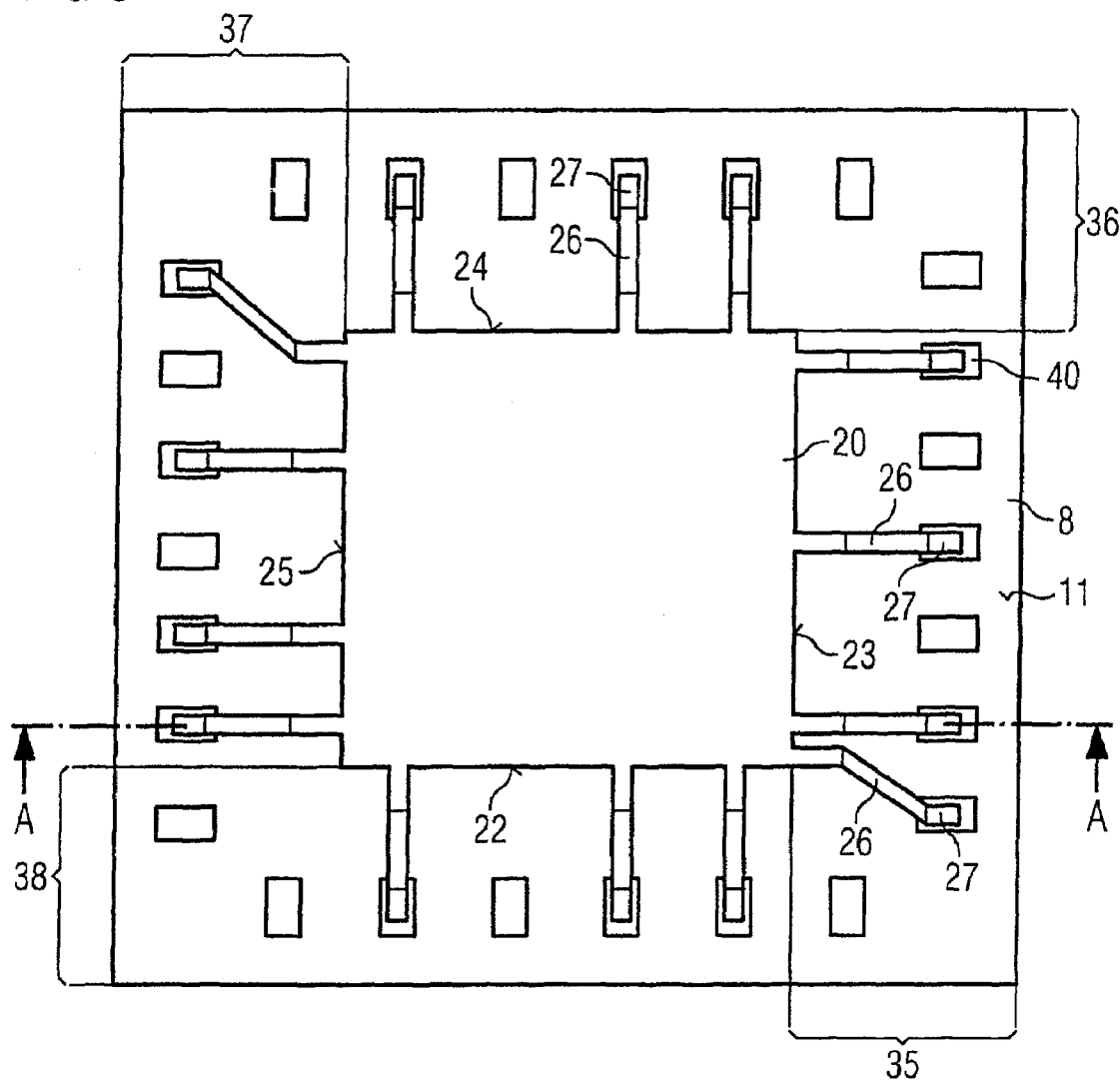

FIG. 3 shows a schematic plan view of the circuit carrier 8 from FIG. 1 after fitment of a metal plate 20 (i.e., screening plate). This metal plate 20 includes leads 26 angled on its edge faces 22, 23, 24 and 25, and these leads 26 are connected by their free ends 27 to the contact connecting pads 40 in the edge areas 35 to 38 of the circuit carrier 8. The angled leads 26 result in the metal plate 20 covering the semiconductor chip 7 arranged underneath it, but at a distance, forming an intermediate space 44 (shown in FIG. 4) between the metal plate 20 and the upper face 11 of the circuit carrier 8.

Figure 4:
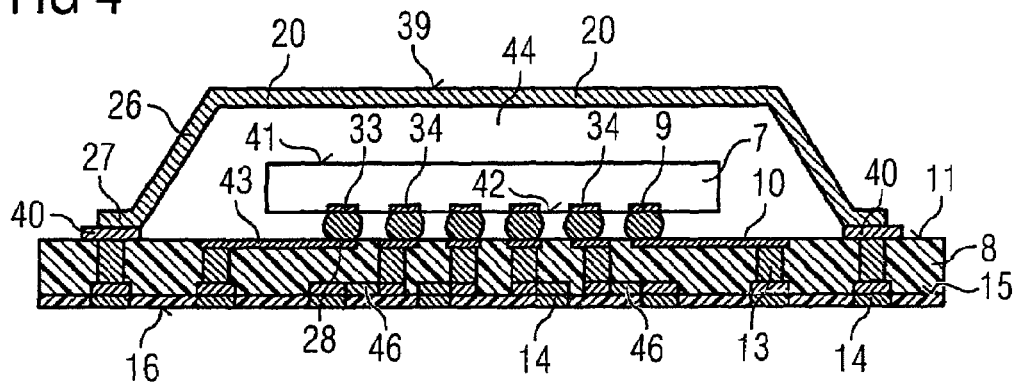

FIG. 4 shows a schematic cross section through the circuit carrier 8 shown in FIG. 3, along the section plane A-A. The metal plate 20, which is supported by the angled leads 26, covers the semiconductor chip 7, with an intermediate space 44 being provided between the rear face 41 of the semiconductor chip 7 and the screening plate 20, so that the screening plate 20 does not touch the semiconductor chip 7. The free ends 27 of the angled leads 26 are soldered to the contact connecting pads 40 on the upper face 11 of the circuit carrier 8. The leads 26 therefore support the self-supporting metal plate 20 above the semiconductor chip 7. Since the angled leads 26 are separated from one another, sufficient intermediate spaces remain between the leads 26 through which a plastic housing compound can be introduced in order to fill the intermediate space 44.

Figure 5:
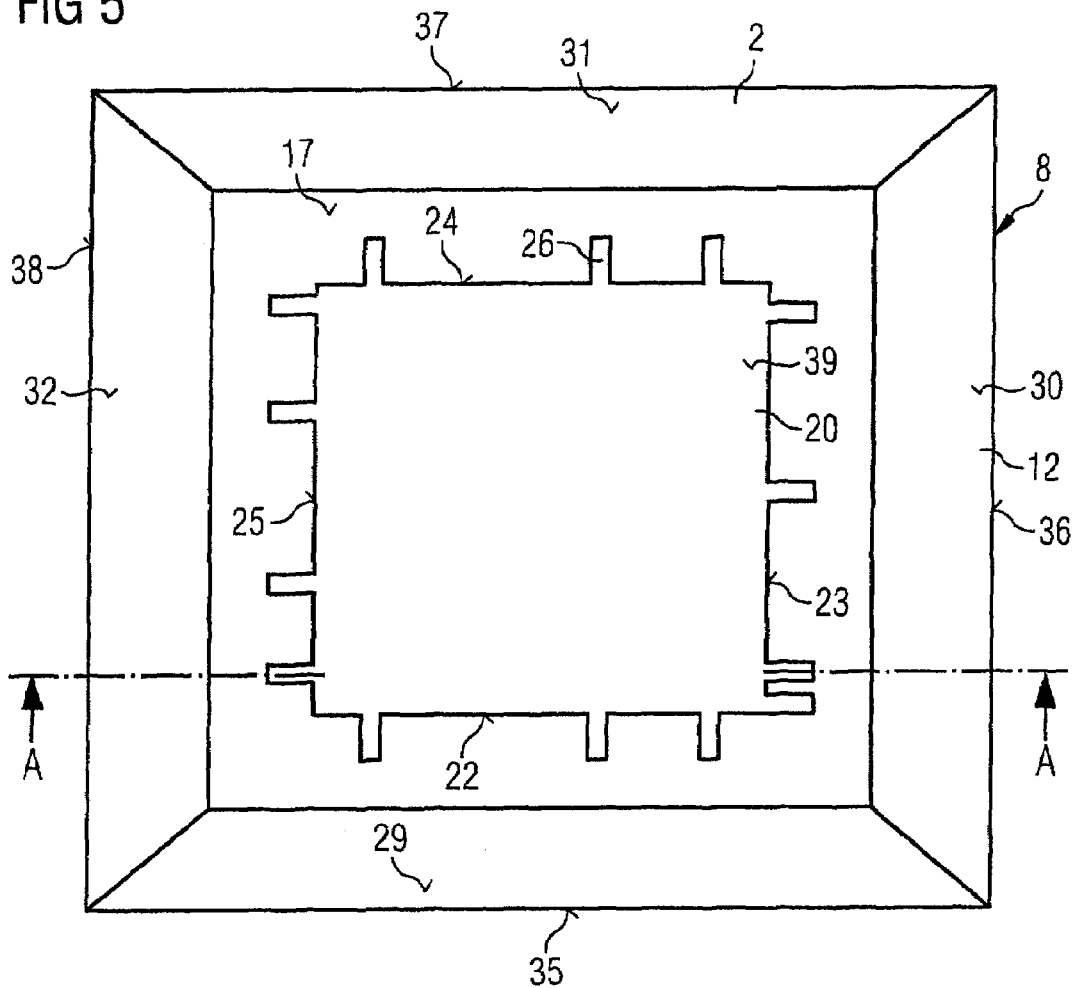

FIG. 5 shows a schematic plan view of a component housing 2 before structuring of the metal plate 20. The component housing 2 comprises a plastic housing compound 12 which embeds the semiconductor chip with its flipchip contacts and the angled leads 26 of the meal plate 20 so that only the upper face 39 of the semiconductor plate 20 remains free of plastic housing compound on the upper face 17 of the component housing 2. The edge faces 29, 30, 31 and 32 of the plastic housing are slightly angled in this exemplary embodiment, so that the contact connecting pads 40, which cannot be seen, and the angled areas of the leads 26 are covered by plastic housing compound 12.

Figure 6:
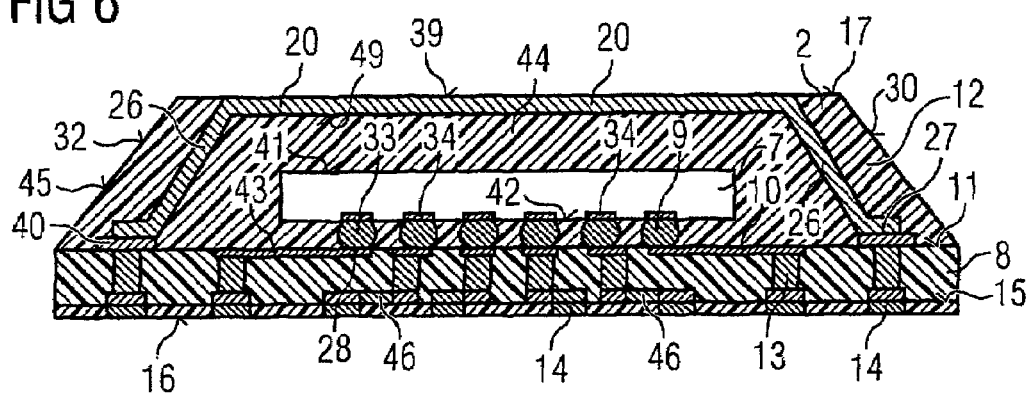

FIG. 6 shows a schematic cross section through the component housing 2 as shown in FIG. 5 along the section line A-A. As can be seen from FIG. 6, the intermediate space 44 between the metal plate 20 and the upper face 11 of the circuit carrier 8, completely filled with plastic housing compound 12, extends beyond the angled leads 26 so that the free ends 27 of the angled leads 26 on the contact connecting pads 40 are also encapsulated by the plastic housing compound 12. In this case, the lower face 49 of the metal plate 20 is wetted with the plastic housing compound 12. The upper face 39 of the metal plate 20 is, however, free of plastic housing compound 12, so that the metal plate 20 can now be structured. In one alternative embodiment, the contour 45 of the component housing 2 is matched to the profile of the angled leads 26, so that the leads 26 on the edge faces 29, 30, 31 and 32 of the component housing 2 are freely accessible.

Figure 7:
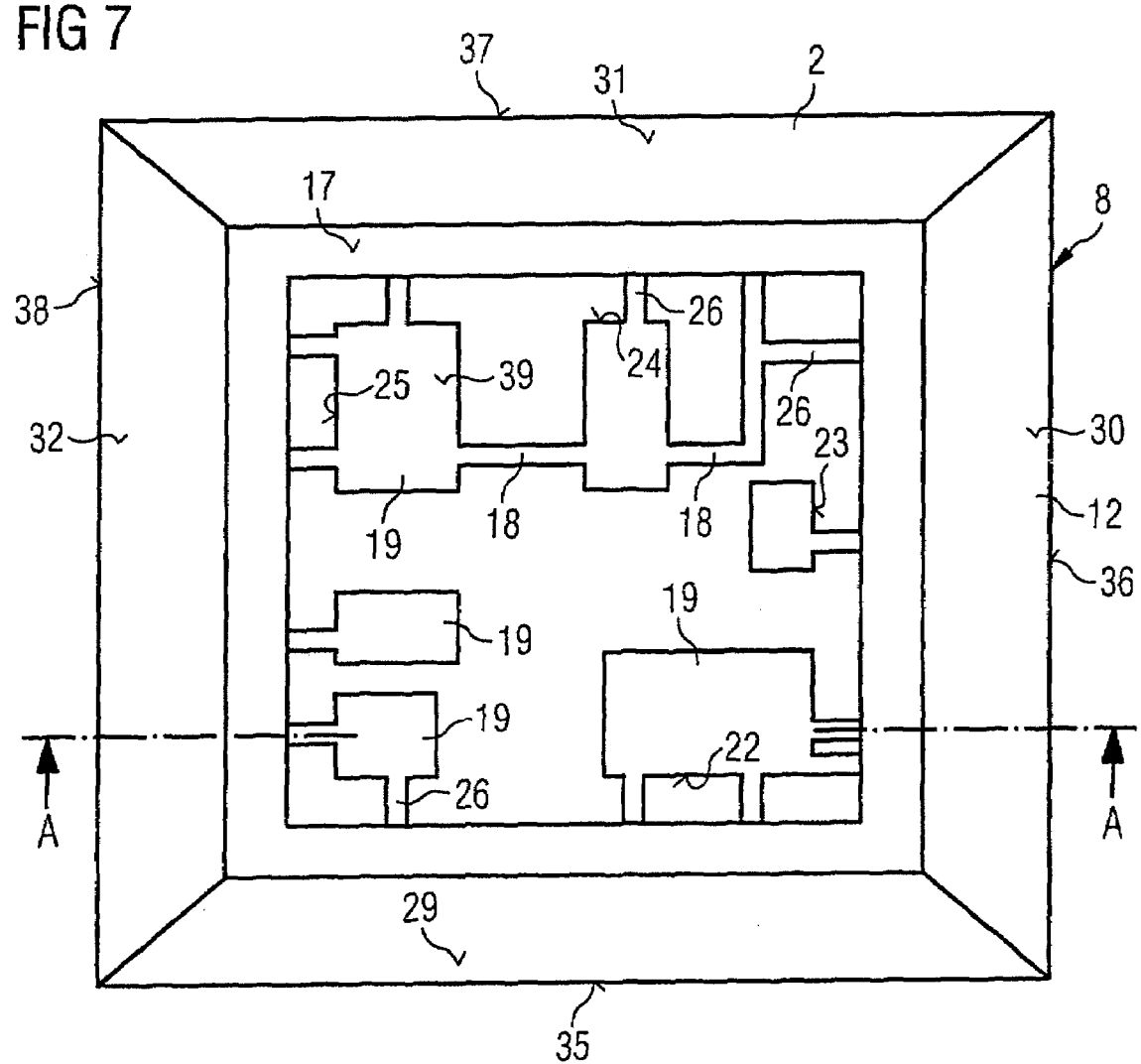

FIG. 7 shows a schematic plan view of the component housing 2 as shown in FIG. 6, after structuring of the metal plate 20. The structuring of the metal plate 20 results in lead interconnects 18 being formed on the upper face 17 of the component housing 2, which are connected to the angled leads 26, as well as contact connecting pads 19 being formed there, which are arranged such that discrete semiconductor components can be arranged between them, in which case the electrodes of these discrete semiconductor components can be electrically conductively fixed to the contact connecting pads 19.

Figure 8:
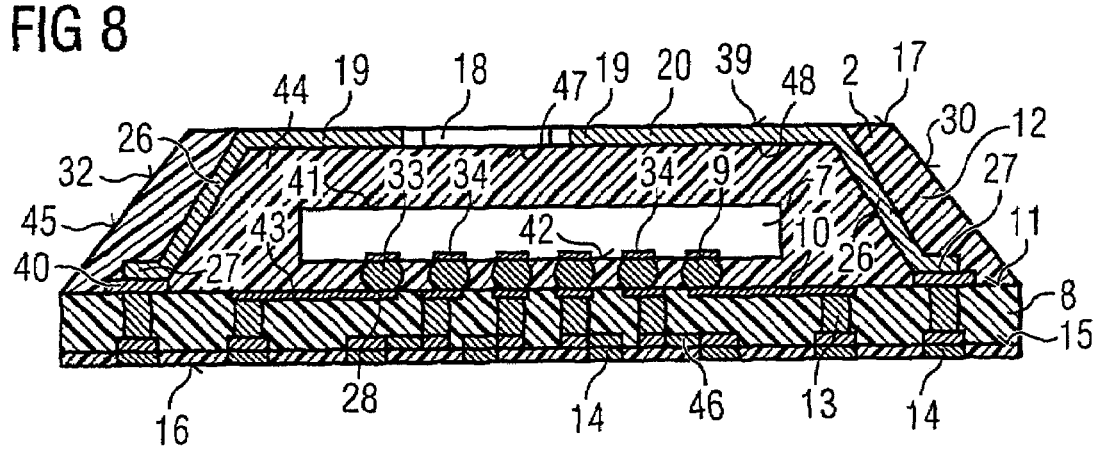

FIG. 8 shows a schematic cross section through the component housing 2 as shown in FIG. 7, along the section plane A-A. As shown by this cross section, the lower faces 47 of the lead interconnects 18 and the lower faces 48 of the contact connecting pads 19 are embedded in the plastic housing compound 12, while the upper faces and edge faces are free of plastic. Discrete components can now be arranged and stacked on the upper face 17 of the component housing 2, between the contact connecting pads 19.

Figure 9:
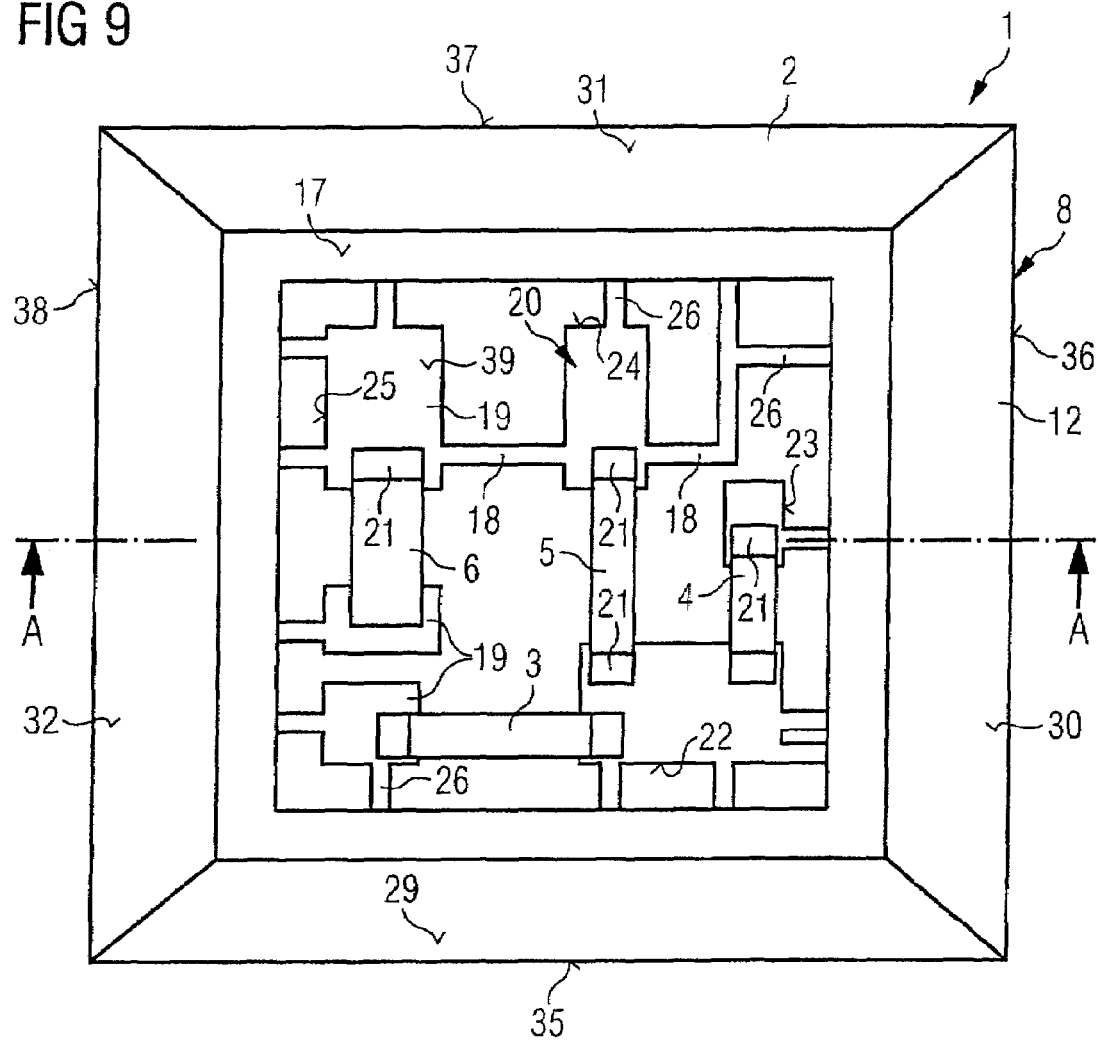

FIG. 9 shows a schematic plan view of the electronic module 1 according to one exemplary embodiment. Components 3, 4, 5 and 6 are now arranged, stacked between the contact connecting pads 19, with their electrodes 21 on the structured metal plate 20. In addition, the lead interconnects 18 connect some of the contact connecting pads 19 to one another and some of them to the angled leads 26. Furthermore, the leads 26 are electrically connected to the contact connecting pads 19.

Figure 10:
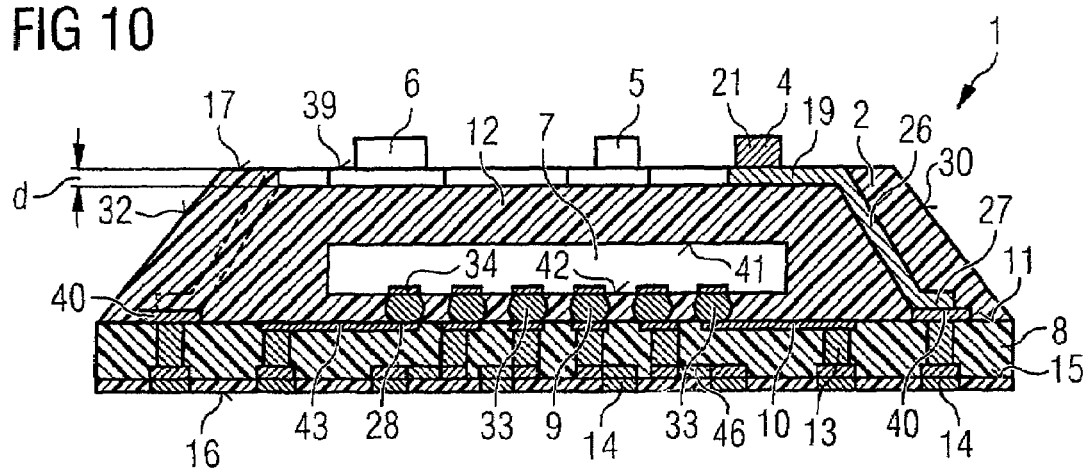

FIG. 10 shows a schematic cross section through the electronic module 1 according to the exemplary embodiment, along the section plane A-A as shown in FIG. 9. The structuring of the metal plate 20 on the upper face 17 of the component housing 2 results in the upper face 17 being recessed between the contact connecting pads 19 by the thickness d of the metal plate 20 with respect to the surrounding edge of the upper face 17 of the component housing 2.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An electronic module, comprising:
a component housing;
a circuit carrier comprising a plurality of edge area contact connecting pads arranged in edge areas of an upper surface of the circuit carrier;
at least one integrated circuit chip arranged on the circuit carrier in the component housing, the integrated circuit chip being electrically connected to the circuit carrier via connection elements, wherein the integrated circuit chip, the connection elements, the edge area contact connecting pads, and at least a portion of the circuit carrier are embedded in a plastic housing compound; and a self-supporting, structured metal plate fixed to the edge area contact connecting pads of the circuit carrier, the structured metal plate including:
   at least one structured element disposed on an upper face of the component housing, the at least one structured element including a lower face embedded in the plastic housing compound; and
   a plurality of leads spaced apart from each other and extending between the at least one structured element and the edge area contact connecting pads, the leads including angled portions that constitute side faces of the structured metal plate and that are embedded in the plastic housing compound.

2. The electronic module according to claim 1, wherein the at least one structured element is a lead interconnect or a contact connecting pad.

3. The electronic module according to claim 1, further comprising:
   at least one discrete component stacked on the structured metal plate.

4. The electronic module according to claim 3, wherein electrodes of the stacked component are integrally connected to the at least one structured element of the structured metal plate on the component housing.

5. The electronic module according to claim 3, wherein the at least one discrete component is an active component selected from the group including: diodes, transistors, triacs, thyristors, and varistors.

6. The electronic module according to claim 3, wherein the at least one discrete component is a passive component selected from the group including: resistors, capacitors, and inductive components.

7. The electronic module according to claim 1, wherein the circuit carrier further comprises:
   a wiring structure disposed on an upper face of the circuit carrier, the wiring structure including:
      the plurality of edge area contact connecting pads to connect the leads of the structured metal plate to the circuit carrier; and
      a plurality of further contact connecting pads to connect the connection elements of the integrated circuit chip to the circuit carrier.

8. The electronic module according to claim 7, wherein circuit carrier further comprises:
   a plurality of external contact pads arranged on a lower face of the circuit carrier; and
   a plurality of vias to electrically connect the wiring structure through the circuit carrier to the external contact pads;
   wherein a lower face of the component housing is a lower face of the circuit carrier.

9. The electronic module according to claim 7, wherein the connection elements of the integrated circuit chip are integrally connected to the further contact connecting pads of the wiring structure.

10. The electronic module according to claim 9, wherein the connection elements are elements selected from the group including: flipchip contacts and bonding wires.

11. The electronic module according to claim 1, wherein the structured metal plate comprises a leadframe.

\* \* \* \* \*